United States Patent [19]
Block et al.

[11] Patent Number: 6,105,749
[45] Date of Patent: Aug. 22, 2000

[54] ENHANCED MATRIX TRAY FEEDER

[75] Inventors: Elmer E. Block; Michael Richard Smith, both of Rochester, Minn.

[73] Assignee: International Business Machines Corporation, Armonk, N.Y.

[21] Appl. No.: 08/977,534

[22] Filed: Nov. 25, 1997

[51] Int. Cl.[7] .................................................. B65G 47/10
[52] U.S. Cl. ................................. 198/370.03; 198/468.8
[58] Field of Search ......................... 198/370.03, 370.04, 198/346.3, 468.6, 468.8

[56] References Cited

U.S. PATENT DOCUMENTS

| | | | |
|---|---|---|---|
| 3,735,853 | 5/1973 | Lingg et al. ...................... | 198/370.03 |
| 4,144,961 | 3/1979 | Kasahara et al. ................. | 198/468.8 X |
| 4,219,301 | 8/1980 | Freeman .......................... | 198/468.8 X |
| 4,305,495 | 12/1981 | Zinke et al. ..................... | 198/346.3 X |
| 4,911,281 | 3/1990 | Jenkner .......................... | 198/370.03 X |
| 5,242,045 | 9/1993 | Kakida et al. .................... | 198/468.6 |
| 5,489,017 | 2/1996 | Bonnet ............................ | 198/370.04 |

OTHER PUBLICATIONS

Matrix Tray Platform, T44976203, Rev. 4, Universal Instruments Corporation, Technical Publications, Jan. 1995, pp. 1–3 and 5–7.

*Primary Examiner*—James R. Bidwell
*Attorney, Agent, or Firm*—Robert H. Berdo, Jr.

[57] ABSTRACT

A matrix tray feeder includes a matrix tray platform, which includes a pan for receiving a component, and an adjustment mechanism connected to the pan. The adjustment mechanism is activatable to move the pan from a first position to a second position while maintaining a surface of the pan in one of an infinite number of substantially parallel planes. A position indicator is positionable adjacent to the surface of the pan, and includes an arrangement for indicating when the component is in a desired position during the activation of the adjustment mechanism.

18 Claims, 5 Drawing Sheets

ENHANCED MATRIX TRAY FEEDER

BACKGROUND OF THE INVENTION

1. Field of the Invention

The invention relates to an enhanced matrix tray feeder, and in particular, to an enhanced arrangement for feeding matrix tray packaged components to a general purpose surface mount placement machine used in the manufacturing of electronic assemblies.

2. Background Information

Electronic assemblies, such as printed circuit cards, for example, are used in a variety of electrical and electronic devices to secure, arrange and interconnect a number of electrical components, for example, within the devices. Typically, the electrical components on the card include a variety of different types. For example, a card may contain electronic components contained in packaging known as chips, which are relatively small, as well as larger parts, such as plastic leaded chip carriers (PLCC) and quad flat packs (QFPs), for instance.

In general, there are two basic types of printed circuit cards. The first type includes cards having pin-through-hole parts located thereon. This type of card has a plurality of holes therethrough. The parts or components to be located on the card have legs (pins) which fit through the holes, and are crimped, for example, to secure the component to the card.

The second type of card is known as a surface mount card, which may also include pin-through-hole-parts. This type of card has a pad on a top surface thereof, on which a component lead is placed for securing the component to the card. The technology for applying the components in this manner is known as surface mount technology (SMT). The procedure associated with SMT includes, in general, the use of a screen printer, and one or more component placement machines, for example, a high-speed placer, and a general purpose placement machine. The screen printer applies solder paste to a card, whereas the component placement machines populate the card with various components, as will be described in more detail in the following paragraphs. After the card is completely populated with components, it is moved through an oven, where the solder paste is reflowed.

The screen printer is used to selectively deposit solder paste onto a bare card, i.e., a card that does not have any components thereon. A stencil is provided, which has a plurality of apertures formed therein that correspond to predetermined pad and copper plating locations to be formed on the card. The screen printer uses a set of blades to push the solder paste through the apertures of the stencil and onto the card.

After the solder paste is deposited onto the card, the card may be moved to the high-speed placer (also known as a chip shooter), and then to the general purpose placement machine. Alternatively, the card may be moved directly to the general purpose placement machine from the screen printer.

There are many types of general purpose placement machines, such as general purpose placement machine model 4861A-GSM, manufactured by Universal Instruments Corporation in Binghamton, N.Y. The general purpose placement machine is typically adapted to place a large variety of components onto the card. For example, the components can include small components, such as the aforementioned chips, as well as relatively larger components, such as quad flat packs (QFPs), ball grid array modules (BGAs), and plastic leaded chip carriers (PLCCs), for example.

The general purpose placement machine typically includes a plurality of pick-up heads, each of which is adapted to pick up a selected component for placement onto the card. For example, each head can be provided with a removable nozzle specifically adapted for the component to be picked up. When the general purpose placement machine is activated, a program is run. The program causes the heads to move and be activated in a predetermined manner, based on the type of card being built.

Typically, the components are located in one of a variety of known packaging arrangements prior to their placement onto the card. The packaging holds the components in predetermined locations, and allows for a plurality of components to be rapidly fed to the general purpose placement machine.

Moreover, the general purpose placement machine is typically adapted to hold a plurality of packaging arrangements for each type of card being built. The packaging arrangements can include, for example, a tape reel with a tape having the components located thereon. The tape is fed to the general purpose placement machine using a tape feeder, with the components being removed from the tape using the heads of the general purpose placement machine.

It is also known to package the components in tubes, with the components being sequentially arranged within the tube.

Alternatively, or in addition to the aforementioned packaging arrangements, the components can be arranged on matrix trays. Each matrix tray holds the components in a matrix formation, with the components being arranged in columns across the width of the tray, and in rows down the length of the tray. As is known, there are a large variety of matrix trays which can be used with the general purpose placement machine, depending on the size and the number of components located on the tray.

The matrix trays may be supplied to the general purpose placement machine in several different ways. For example, the general purpose placement machine may have a so-called a tray supplier device. One or more matrix trays are placed into this device, which elevates or lowers the trays to a pick-up point. The parts are then transferred from the tray to the conveyor belt, where they are subsequently picked up by the head of the general purpose placement machine.

Alternatively, the matrix trays can be individually placed on a matrix tray feeder. The matrix tray feeder, with the matrix tray located thereon, is positioned beneath the heads of the general purpose placement machine. One or more heads of the general purpose placement machine moves over a selected component in accordance with a program, and picks the component up from the matrix tray for subsequent placement onto the card.

Typically, each head uses a vacuum nozzle for picking up the components from the matrix tray feeder. The vacuum nozzles are movable in a vertical direction, i.e., toward and away from the selected components. When properly positioned, and activated by the program, the nozzle moves a predetermined distance toward the selected component, and picks the component up off from the tray using its generated vacuum. However, as will be appreciated, it is important that the component be precisely located in the vertical direction. Otherwise, when the nozzle is moved to its extreme position toward the component, the component may be too far away from the vacuum nozzle, and will not be picked up by the nozzle. Alternatively, the component may be too close to the nozzle, which can cause the nozzle or component to break when the nozzle comes in contact with the component at the nozzle's extreme position.

There are various ways in which the vertical position of the matrix tray can be set. For example, the tray can be set upon a platform specifically configured for the type of tray and/or component located thereon, so that once the tray is in place on the platform, the upper surface of the component is at the ideal height, i.e., at the height necessary for pick-up by the nozzle without damage. However, this arrangement requires a number of specifically tailored platforms, each of which is used with a specific component and/or tray. Thus, a number of different platforms must disadvantageously be manufactured and stored. Further, in order to switch from one type of tray to another type of tray, the platforms must likewise be switched. This usually requires that the operation of the general purpose placement machine be halted while the platforms are switched, resulting in a loss in production.

It is also known to provide a height adjustable platform, in which the vertical position of the platform can be adjusted. With these known platforms, the height can be adjusted using a cam lift mechanism. However, the cam lift mechanism is imprecise, and may not on its own hold the platform in the selected height during the operation of the general placement machine. As such, there is a need for a precisely adjustable platform that can retain its selected height during the entire operation of the general placement machine.

Further, the height adjustment of the known platform is accomplished while the platform is in the general purpose placement machine, making precise adjustments relatively difficult. Thus, there is a need for an adjustable platform that can be adjusted in a more user-friendly environment, such as outside of the general purpose placement machine.

Additionally, the height of the platform is usually set by "eye balling" the top of the component against some reference point while the platform is in the machine. However, this method of adjustment is imprecise. Therefore, there is a need for a precise, easy and quick way of adjusting the height of the platform.

Further, because the known platform is positioned within the machine, typically the operation of the general purpose placement machine must be halted merely to switch one empty matrix tray for a new, full matrix tray. Thus, there is a need for a platform which will allow for the loading of matrix trays without requiring that the operation of the machine be halted.

SUMMARY OF THE INVENTION

It is, therefore, a principal object of this invention to provide an enhanced matrix tray feeder.

It is another object of the invention to provide an enhanced matrix tray feeder that solves the above mentioned problems.

These and other objects of the present invention are accomplished by the matrix tray feeder disclosed herein.

According to one aspect of the invention, a matrix tray feeder includes an adjustable matrix tray platform, a transport arrangement upon which the matrix tray platform is mounted, and a position indicator, which indicates to an operator when the matrix tray platform is set at a desired location, for example, the desired height. These three components advantageously interact to provide a matrix tray feeder which is easy to use, is applicable for use with a wide variety of matrix trays, and is simple to operate and maintain.

According to a further aspect of the present invention, the matrix tray platform accommodates a matrix tray that contains components for placement onto a card using a so-called general purpose placement machine. The matrix tray platform includes an arrangement for moving the matrix tray in a direction essentially perpendicular to the surface of the matrix tray. For example, the mechanism can be a height adjustment mechanism for moving the matrix tray upward and downward.

The height adjustment mechanism preferably operates on a screw-type scissors jack principle. This arrangement advantageously allows the matrix tray to be raised or lowed in continuous increments, while maintaining the matrix tray in a level position.

Preferably, a threaded rod, which engages a threaded member attached to legs of the height adjustment mechanism, is provided for operating the height adjustment mechanism. If the threaded rod is provided with a fine pitch thread, for example, 28 threads per inch, the height of the matrix tray can advantageously be precisely set, and held in position without requiring a locking mechanism, by virtue of the frictional force of the threads.

According to another aspect of the invention, the matrix tray platform is located upon the transport arrangement. The transport arrangement includes a slide, upon which the matrix tray platform is mounted. The slide is slidably positioned upon one or more linear rails. The slide, and hence the entire matrix tray platform, are advantageously positionable over the entire length of the rails, while maintaining the precise height setting of the height adjustment mechanism.

According to a further aspect of the invention, the slide can have a handle attached thereto. The handle advantageously has a length which allows the slide to be easily pushed from a front of the rails, to the back of the rails, i.e., in a region of the general purpose placement machine, that is, a component pick-up position. Preferably, the handle is pivotally connected to the slide, so that when the slide is positioned at the front of the rails, the handle can be pivoted from a position parallel to the rails, to a position perpendicular to the rails. In other words, the handle can be pivoted out of the way, so that it does not project out from the front of the rails. The transport arrangement thus advantageously allows the entire matrix tray platform to be moved toward and away from the general purpose placement machine to a position where matrix trays can be easily placed on the matrix tray platform, and so that the adjustment mechanism can be more readily operated.

According to a further aspect of the invention, the position indicator includes a mechanical, visual indicator having an end pivotally connected to an distal end of a bracket, which is attached to a base member. When pivoted, the indicator can be positioned over the surface of a component located in a matrix tray disposed upon the matrix tray platform, which allows the position of the component to be easily determined and set.

The indicator has a slot therein for accommodating a lever sized to fit within the slot. The lever is arranged to pivot within the slot, and is connected to a pin located within the indicator. Pressing on the end of the lever will cause the lever to pivot, and move the pin. The position of the components in the matrix tray can be easily determined by raising the matrix tray until the pin deflects or moves. This will allow an operator to easily and accurately determine when the matrix tray is at a correct height.

According to a further aspect of the invention, a method of setting a height of a component is proposed, which includes locating a component on a pan, positioning an indicator over the component, raising the pan until the component contacts and moves the indicator, and determining a height of the component based on an amount of movement of the indicator. This method advantageously provides a precise way of repeatably setting the vertical position of the component, regardless of the component type.

According to another aspect of the invention, a method of feeding a component to a component placement machine is proposed. The method includes placing a component on the matrix tray platform, positioning an indicator over the component, raising the component until the component contacts and moves the indicator, determining a height of the component based on an amount of movement of the indicator, repositioning the indicator away from the component, and sliding the matrix tray platform toward the general purpose placement machine to a component pick-up position, while maintaining the height of the component. This method advantageously provides for a safe, effective and precise way to load and set the height of the components.

DETAILED DESCRIPTION OF THE PREFERRED EMBODIMENTS

The invention will now be described in more detail by way of example with reference to the embodiments shown in the accompanying figures. The following described embodiments are only presented by way of example and should not be construed as limiting the inventive concept to any particular physical configuration.

Figure 1:
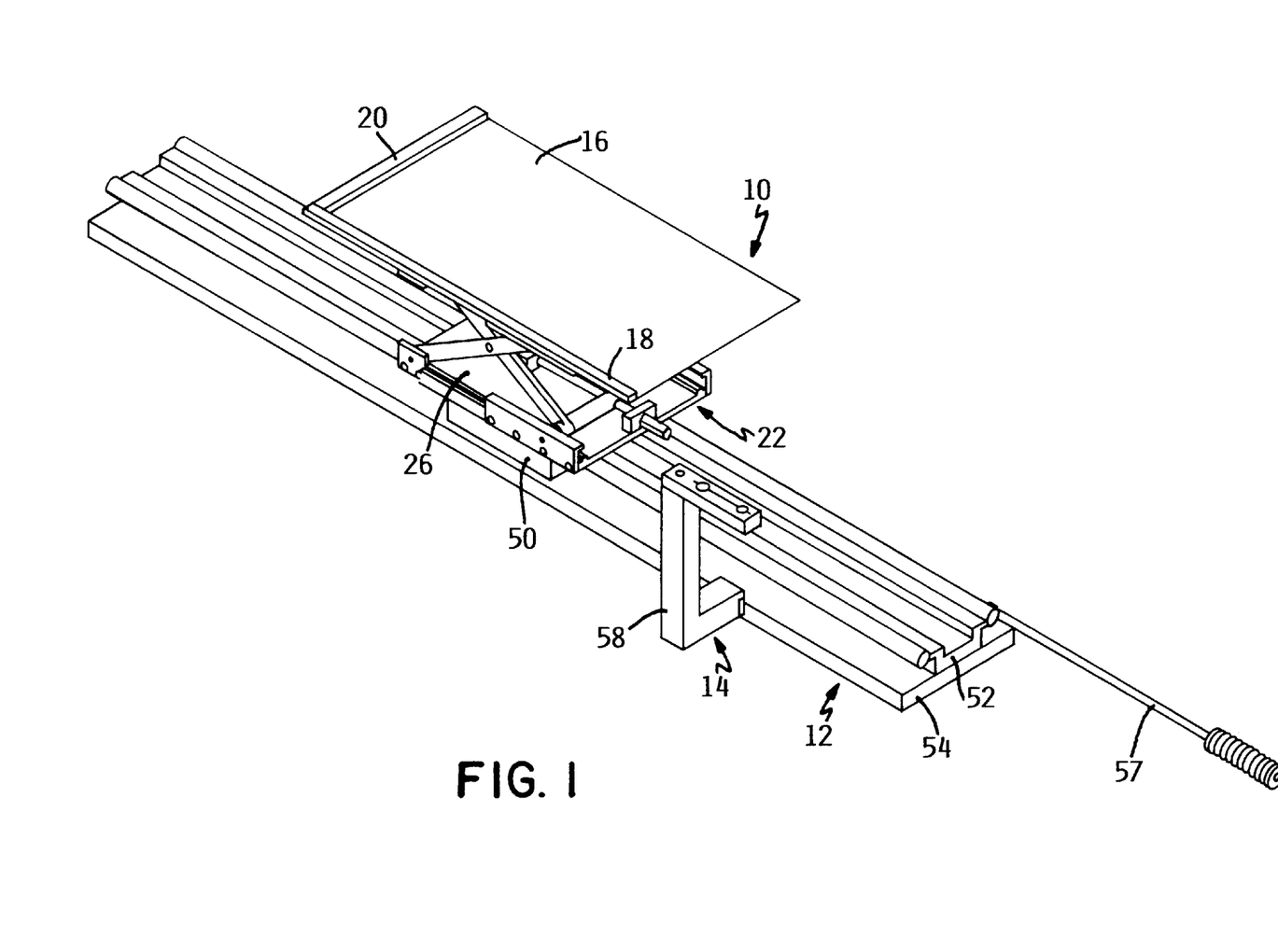
FIG. 1 is a perspective illustration of a matrix tray feeder according to an exemplary embodiment of the invention.
Figure 2:
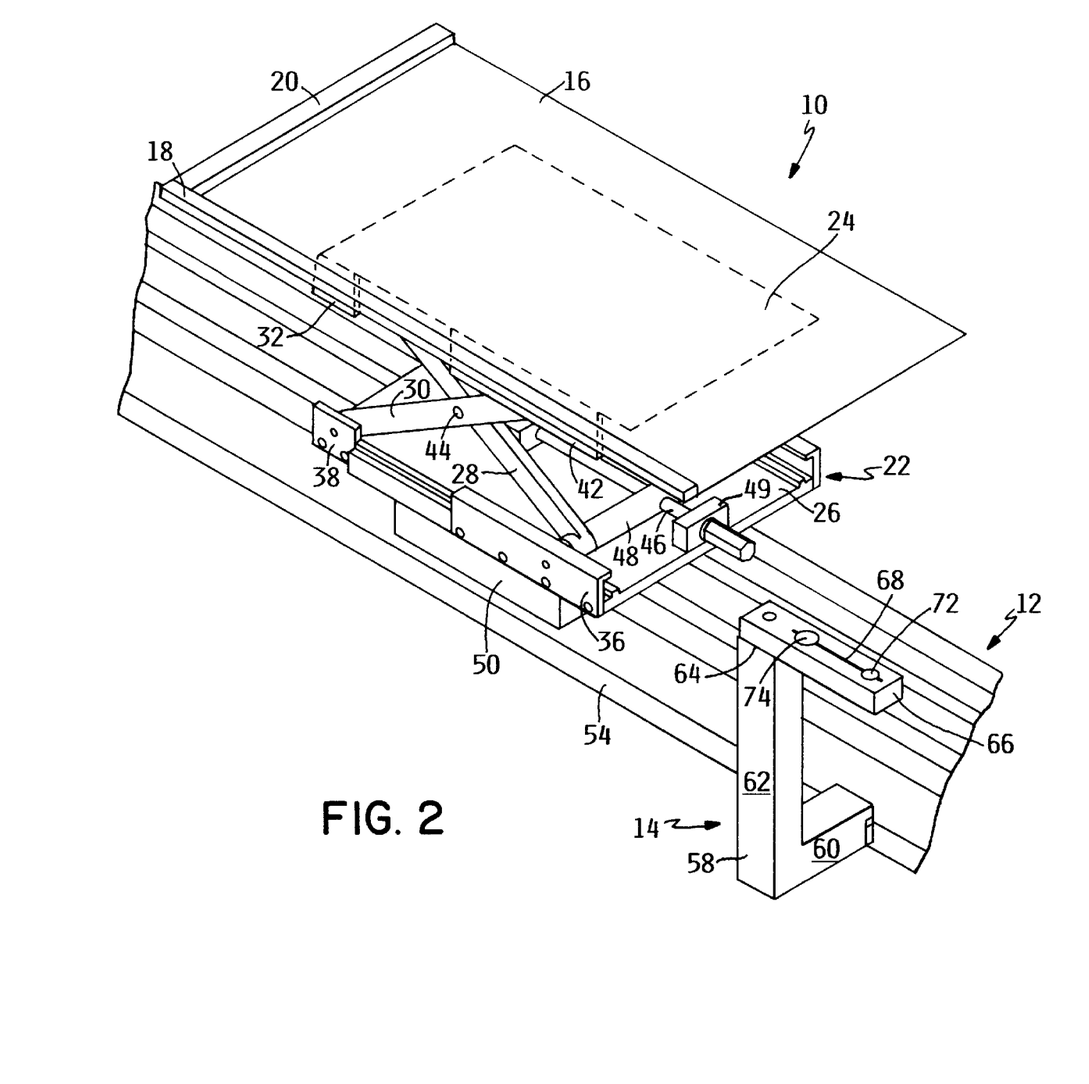
FIG. 2 is an enlarged, partial, perspective, view of the matrix tray feeder shown in FIG. 1.

Referring to FIGS. 1 and 2, an exemplary embodiment of a matrix tray feeder according to the present invention is illustrated. In general, the matrix tray feeder includes a matrix tray platform 10 that is, for example, adjustable in height, and a transport arrangement 12 upon which the matrix tray platform 10 is mounted. The matrix tray feeder further includes a position indicator 14, which informs the operator when the matrix tray platform 10 is set at a desired location, for example, the desired height. Each of these assemblies will be sequentially described in detail in the paragraphs that follow.

The matrix tray platform 10 includes a pan 16, which in this exemplary embodiment is an essentially planar, rectangular plate, although other shapes and configurations are within the scope of the invention. The pan 16 accommodates a matrix tray (not shown) that contains components for placement onto a card using a so-called general purpose placement machine. The aforementioned matrix tray, components, card and general purpose placement machine are all well known, and thus are not illustrated.

Preferably, pan 16 has a first rail 18 and a second rail 20 arranged on an upper surface of the pan and along two respective perpendicular edges of the pan. During operation, the matrix tray is positioned on the upper surface of pan 16, and against the first rail 18 and second rail 20. In order to retain the matrix tray in position on the upper surface of the pan 16, the pan can be composed of a ferro-magnetic material, and magnets (not shown) can be magnetically attached to the pan and against the free edges of the matrix tray. The magnets would thus prevent the matrix tray from sliding away from rails 18 and 20. However, other means of fixing the matrix tray to pan 16 are within the cope of the present invention.

The matrix tray platform 10 further includes an arrangement for moving he pan 16 in a direction essentially perpendicular to the surface of the pan, and toward the nozzles of a general purpose placement machine (not illustrated). For example, in this embodiment, the mechanism is a height adjustment mechanism 22, although other directions of movement are within the spirit of the invention.

The height adjustment mechanism 22 is illustrated as operating on a screw-type scissors jack principle, although other types of adjustment mechanisms are possible within the scope of the invention. In particular, at least one pair of pivotally connected linking arms are caused to "open" or "close", similar to the opening or closing of a pair of scissors, by turning a threaded rod, as will be described.

The height adjustment mechanism includes a first plate 24 (shown only in hidden lines in FIG. 2) attached to a lower surface of pan 16, and a second plate 26 positioned parallel to, and directly beneath first plate 24. Plates 24 and 26 are similarly configured, and are joined together by at least two (i.e., one pair) crossed linking arms 28, 30. However, the illustrated embodiment utilizes two pairs of crossed linking arms, although for reasons of clarity, only the pair of linking arms closest to the viewer are illustrated.

In particular, each pair of linking arms is arranged along a respective longitudinal edge of the plates 24 and 26. One end of each respective arm 28 is pivotally attached to a projecting member 32 positioned near a rear of the longitudinal edge of first plate 24. The opposite end of each respective arm 28 has a circular, wheel shaped bearing (not shown) connected thereto, which is slidably disposed within a guide 36 positioned near a front of the longitudinal edge of second plate 26. Similarly, one end of each respective arm 30 is pivotally attached to a projecting member 38 positioned near a rear of the longitudinal edge of second plate 26. The opposite end of each respective arm 30 has a circular, wheel shaped bearing (not shown) connected thereto, which is slidably disposed within a guide 42 positioned near a front of the longitudinal edge of first plate 24. For reasons of clarity, the bearings have not been illustrated, but such bearings are well understood to those skilled in the art. Of course, other types of bearings are within the scope of the present invention. As will be appreciated, this arrangement causes the linking arms 28, 30 of each respective pair of arms to cross each other, with one end of each arm being movable in a linear direction, and the other end being pivotally fixed. The linking arms 28, 30 are joined together at a pivot point 44, which maintains the crossing point of the respective linking arms 28, 30 at a set position.

As the respective ends of the arms 28, 30 that have the bearings attached thereto are moved toward the respective ends of the arms pivotally attached to the projecting members 32, 38, the first plate 24 will be moved in a direction away from the second plate 26. Similarly, as the respective ends of the arms 28, 30 that have the bearings attached thereto are moved away from the respective ends of the arms pivotally attached to the projecting members 32, 38, the first plate 24 will be moved in a direction toward the second plate 26.

Preferably, the movement of the ends of the arms 28, 30 can be performed by turning a threaded rod 46. In particular, the threaded rod 46 in this exemplary embodiment is threaded through a member 48 that is pivotally connected to the movable end of the arm 28 and is slidably connected to the second plate 26. For example, the member can be a shaft 48 that connects the movable ends of the arms 28 of each respective pair of arms together. In particular, the ends of shaft 48 may pass through the respective movable ends of the arms 28, and be connected, either directly or indirectly, to the aforementioned bearings (not shown). As such, the shaft 48 will move in alignment and simultaneously with the movable ends of arms 28.

Shaft 48 can have a threaded hole extending therethrough in a direction parallel to a center axis of rod 46. Second plate 26 can further be provided with a fixed mounting member 49 having a hole therethrough which is in alignment with the threaded hole within shaft 48. The threaded rod 46 is positioned within the hole in member 49, and is free to rotate therein. However, the member 49 prevents the threaded rod 46 from moving in a direction along its axis, using any known means. For example, nuts (not shown), which are too large to fit through the hole in member 49, can be threaded onto the threaded rod 46, and on both sides of the member 49. Other means of preventing a linear movement of the threaded rod 46 are within the scope of the invention.

When the threaded rod 46 is rotated about its axis (using, for example, a wrench, not shown), the shaft 48 is caused to move along the threaded rod, which simultaneously moves the movable ends of each of the arms 28, causing the linking arms 28, 30 to open or close in a manner similar to the opening or closing of a pair of scissors. This causes the first plate 24 to move toward or away from the second plate 26, while maintaining the plates in parallel to each other. As will be appreciated, this arrangement advantageously allows a matrix tray positioned on pan 16 to be raised or lowed an infinite amount, while maintaining the matrix tray in a level position, i.e., a surface of the pan is always in one of an infinite number of parallel planes.

Other configurations and arrangements of the linking arms and threaded rod are within the spirit of the present invention.

Preferably, the threaded rod has a fine pitch thread, for example, 28 threads per inch. This will allow the height of the matrix tray to be precisely set, and will allow the matrix tray to be held in position without requiring a locking mechanism.

The matrix tray platform 10 is preferably located upon transport arrangement 12. Transport arrangement 12 allows the entire matrix tray platform 10 to be moved toward and away from the general purpose placement machine, so that matrix trays can be easily located on the pan 16, and so that the height adjustment mechanism 22 can be more readily operated.

Figure 3:
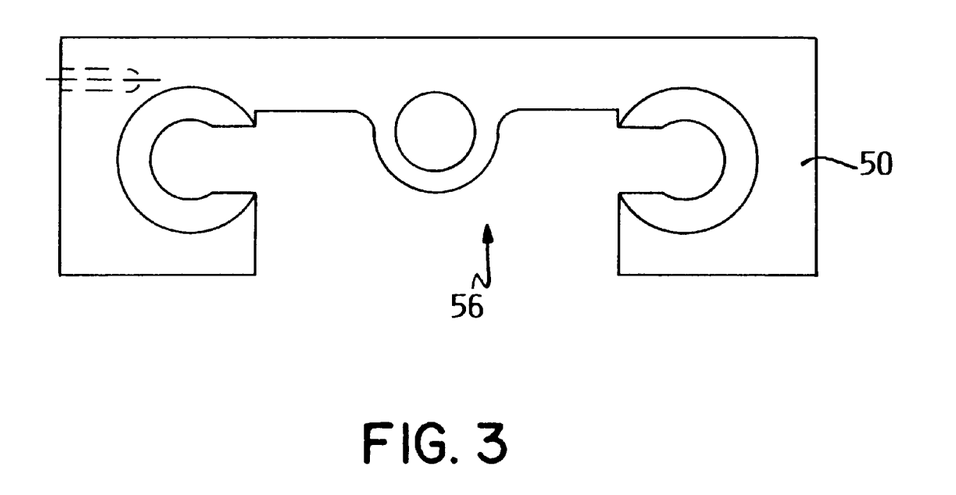
FIG. 3 is an end view of an exemplary slide mechanism of the matrix tray feeder shown in FIG. 1.
Figure 4:
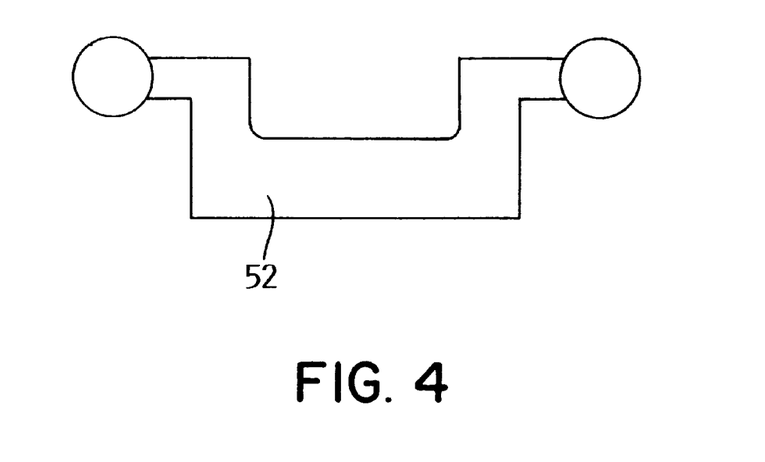
FIG. 4 is an end view of exemplary rails upon which the slide mechanism shown in FIG. 3 can be mounted.

In particular, and referring also to FIGS. 3 and 4, the transport arrangement 12 includes a slide 50, upon which the second plate 26 is mounted. Slide 50 is slidably positioned upon one or more linear rails 52, which are in turn mounted to a base plate 54. The rails 52 can be two parallel Thompson rods arranged about three inches apart, and having a length of about three feet. The slide 50 has a channel 56 for accommodating the rails 52. The channel 56 has a profile similar to the profile of the rails 52, and accommodates the rails 52 within. The slide 50, and hence the entire matrix tray platform 10, are positionable over the entire length of the rails 52, while maintaining the precise height setting of the height adjustment mechanism 22. Further, the slide 50 can be locked in various positions along the rails 52, using for example, ball plungers (not shown). For example, the slide 50 is preferably lockable in a position adjacent to the general purpose placement machine when in a component pick-up position. Other transport arrangements are possible within the spirit of the invention.

The slide 50 can have a handle 57 (FIG. 1) attached thereto. Handle 57 has a length which allows the slide 50 to be easily pushed from a front of the rails 52, i.e., a component load position, to the back of the rails, i.e., a component pick-up position in a region of the general purpose placement machine. Preferably, the handle 57 is pivotally connected to slide 50, so that when the slide 50 is positioned at the front of the rails 52, the handle can be pivoted from a position parallel to the rails, to a position perpendicular to the rails. In other words, the handle 57 can be pivoted out of the way, so that it does not project out from the front of the rails 52.

Preferably, the base plate 54 includes pins (not shown) which are insertable within feeder alignment slots located on the general purpose placement machine. This allows the entire matrix tray feeder to be repeatably removed and installed at designated locations.

As best shown in FIGS. 1 and 2, the position indicator 14 includes an L-shaped bracket 58 fixed to the transport arrangement 12. For example, in the exemplary illustrated embodiment, the bracket 58 has a short leg 60 connected to base plate 54, and arranged to project away from a side edge thereof, i.e., in a direction away from the transport arrangement 12. Bracket 58 further includes a long leg 62 connected to short leg 60 to form the L-shape. Leg 62 has a predetermined height, which is selected so that the upper end 64 of the leg 62 is disposed slightly higher than the desired height of the component. To allow for the setting of different heights, position indicators having varying dimensions can be interchangeably used.

Figure 5:
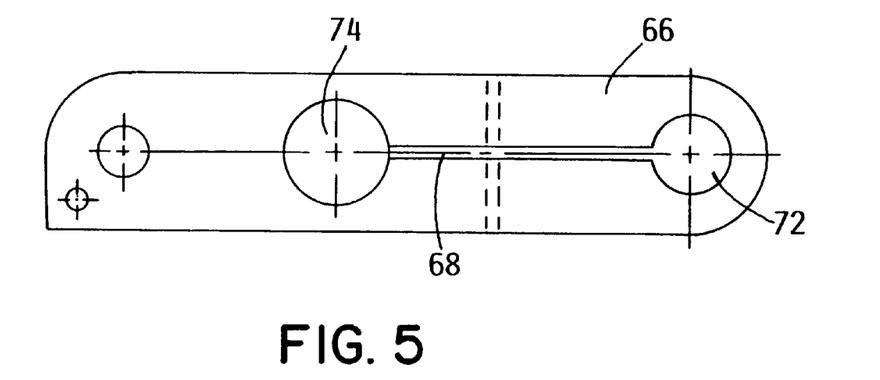
FIG. 5 is a top view of an exemplary position indicator of the matrix tray feeder shown in FIG. 1.

Referring to FIGS. 1, 2 and 5, a mechanical, visual indicator 66 has an end pivotally connected to upper end 64 of leg 62, and is arranged parallel to short leg 60. When pivoted, indicator 66 can be positioned over the upper surface of a component located in a matrix tray disposed upon pan 16.

Figure 6:
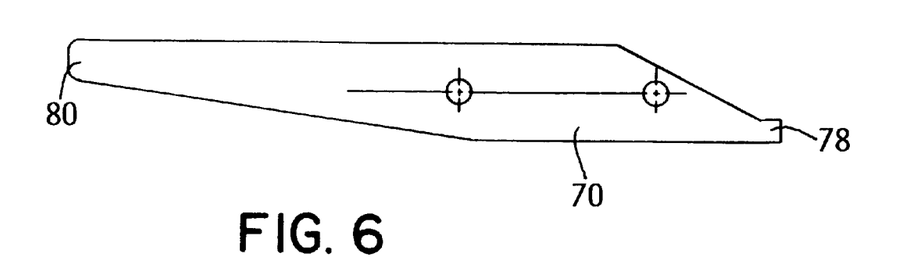
FIG. 6 is an elevational view of an exemplary lever used with the indicator shown in FIG. 5, on an enlarged scale.
Figure 7:
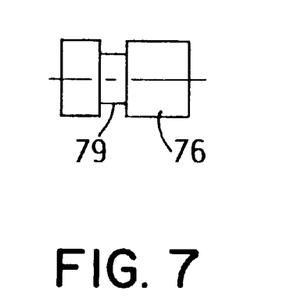
FIG. 7 is a side view of an exemplary pin used with the lever shown in FIG. 6.
Figure 8:
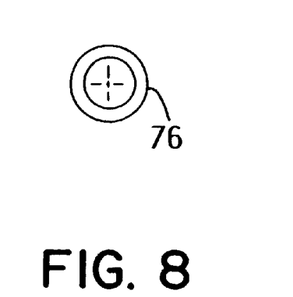
FIG. 8 is a front view of the pin shown in FIG. 7.

Indicator 66 has a slot 68 therein for accommodating a lever 70, such as shown in FIG. 6. For illustration purposes, the lever shown in FIG. 6 is illustrated in an enlarged scale relative to the indicator 66 shown in FIG. 5. However, it will be appreciated that the lever 70 is sized to fit within the slot 68. Slot 68 extends along a length of indicator 66, and is open along an upper surface of indicator 66. A first hole 72 is formed through indicator 66 and at a distal end of the slot 68 (i.e., away from the pivotally connected end of the indicator 66). Further, a second hole 74 is located at the proximal end of slot 68. A cylindrically-shaped pin 76, such as is shown in FIGS. 7 and 8, is movably arranged within the hole 72, and is connected with an end 78 of lever 70. For example, pin 76 can include a groove 79 arranged around a circumference of the pin, which the end 78 fits within. Lever 70 is arranged to pivot within the slot, so that either a lower surface of pin 76 projects through the hole 72, and out past a lower surface of the indicator 66, or an upper surface of pin 76 projects through the hole 72, and out past an upper surface of the indicator 66.

An end 80 of lever 70 opposite to the pin 76 is accessible through hole 74. Pressing on the end 80 of the lever 70 through the hole 74 will cause the lever to pivot, thus raising or lowering pin 76.

Although the position indicator 14 has been described in the exemplary embodiment as having indicator 66, other indicators are within the scope of the invention. Further, other arrangements of the lever 70 and pin 76 may also be possible, without departing from the spirit of the invention.

Figure 9:
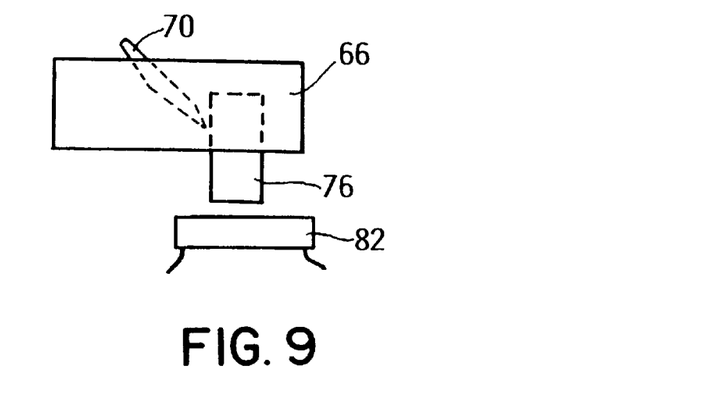
FIGS. 9–11 illustrate the pin and lever shown in FIG. 7 in three respective different positions.
Figure 10:
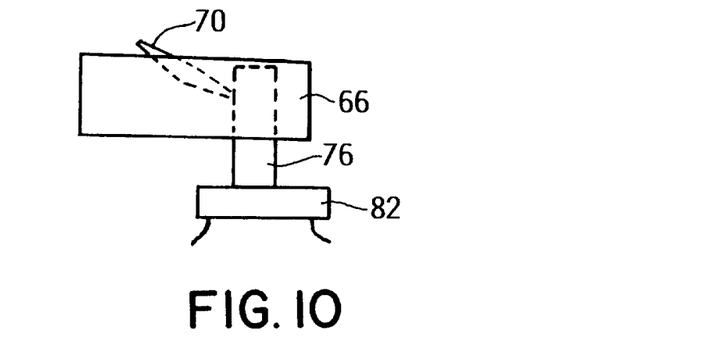
Figure 11:
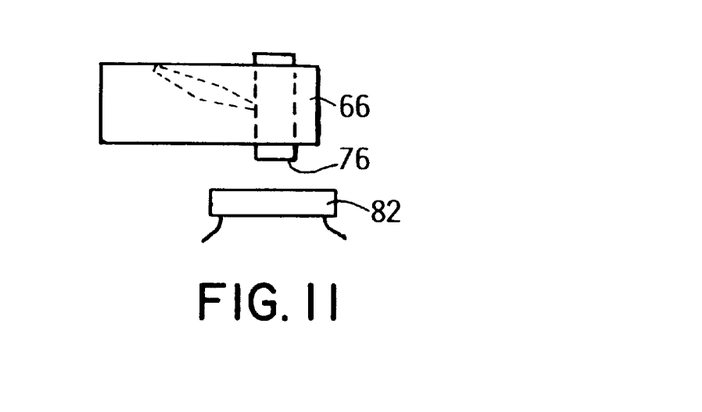

In order to accurately set the height of a matrix tray, an operator first moves the matrix tray platform 10 to a load position, by sliding the matrix tray platform on the transport arrangement 12. Once in position, the operator places the tray on the pan 16, and secures it in position, in the manner previously described. The visual indicator 66 is swung (i.e., pivoted) out over a component 82 within the tray, as shown in FIG. 9. Then, the threaded rod 46 is turned in order to raise the pan 16, and hence the matrix tray, in a direction toward the indicator 66. This will cause the upper surface of the component 82 to push up against the lower surface, for example, of pin 76, as shown in FIG. 10. The component 82 is at the desired height once the upper end of pin 76 is flush with the upper surface of indicator 66. Thereafter, the free end 80 of lever 70 is pressed downward by the operator, which causes the pin 76 to move upwards and away from the upper surface of the component 82, as shown in FIG. 11. The indicator 66 can then be swung away from the matrix tray, and the matrix tray platform 10 moved back into a component pick-up position.

It should be understood, however, that the invention is not necessarily limited to the specific arrangement and components shown and described above, but may be susceptible to numerous variations within the scope of the invention. For example, the height determination could be done electrically with a contact switch, for instance, or optically with an emitter and receiver having a light beam blocked by the pin 76 when the correct height is reached.

It will be apparent to one skilled in the art that the manner of making and using the claimed invention has been adequately disclosed in the above-written description of the preferred embodiments taken together with the drawings.

It will be understood that the above description of the preferred embodiments of the present invention is susceptible to various modifications, changes, and adaptations, and the same are intended to be comprehended within the meaning and range of equivalents of the appended claims.

What is claimed is:

1. A matrix tray platform, comprising:
    a pan for receiving a component; and
    an adjustment mechanism connected to said pan, and including at least one pair of linking arms pivotally connected together in a scissors arrangement, said linking arms being movable relative to each other to move said pan from a first position to a second position while maintaining a surface of said pan in one of an infinite number of substantially parallel planes,
    said adjustment mechanism further comprising a member pivotally connected to a movable end of at least one of said linking arms, and a threaded rod threadably coupled with said member, whereby rotating said rod about an axis of said rod causes said member to move along said rod, thereby causing said linking arms to move relative to each other and allowing said pan to be held in an infinite number of positions.

2. The matrix tray platform of claim 1, wherein one end of one of said linking arms is pivotally connected to an underside of said pan, and one end of the other of said linking arms is slidably mounted to the underside of said pan.

3. A matrix tray platform, comprising:
    a pan for receiving a component; and
    an adjustment mechanism connected to said pan, and including at least one pair of linking arms pivotally connected together in a scissors arrangement, said linking arms being movable relative to each other to move said pan from a first position to a second position while maintaining a surface of said pan in one of an infinite number of substantially parallel planes,
    wherein said at least one pair of arms comprises two pairs of arms, each pair being arranged on an opposite side of said pan; said adjustment mechanism further comprising a shaft connecting said pairs of arms together, and a threaded rod threadably coupled with said shaft, whereby rotating said rod about an axis of said rod causes said shaft to move along said rod, thereby causing said linking arms to move relative to each other.

4. The matrix tray platform of claim 3, wherein said threaded rod has a thread pitch of about 28 threads per inch.

5. A transport arrangement for a matrix tray platform, comprising:
    two, essentially parallel, cylindrically shaped rails; and
    a slide guided upon said rail, and being adapted to accommodate a matrix tray platform, with a distance of the matrix tray platform from said rail being constant along an entire length of said rail, wherein said slide includes a channel having a cross-sectional profile corresponding to a cross-sectional profile of said rails, said rails being accommodated within said channel.

6. A matrix tray feeder, comprising:
    a matrix tray platform, including a pan for receiving a component, and an adjustment mechanism connected to said pan and being activatable to move said pan from a first position to a second position while maintaining a surface of said pan in one of an infinite number of substantially parallel planes; and
    a position indicator positionable adjacent to the surface of said pan, and including means for indicating when the component is in a desired position during the activation of said adjustment mechanism,
    wherein said adjustment mechanism comprises two pairs of linking arms, each linking arm of each respective pair being pivotally connected to the other linking arm of the respective pair in a scissors arrangement, said linking arms being movable relative to each other to move said pan from the first position to the second position,
    wherein each pair of linking arms is arranged on an opposite side of said pan; said adjustment mechanism further comprising a shaft connecting said pairs of arms together, and a threaded rod threadably coupled with said shaft, whereby rotating said rod about an axis of said rod causes said shaft to move along said rod, thereby causing said linking arms to move relative to each other.

7. A matrix tray feeder, comprising:

a matrix tray platform, including a pan for receiving a component, and an adjustment mechanism connected to said pan and being activatable to move said pan from a first position to a second position while maintaining a surface of said pan in one of an infinite number of substantially parallel planes; and a position indicator positionable adjacent to the surface of said pan, and including means for indicating when the component is in a desired position during the activation of said adjustment mechanism, wherein said adjustment mechanism comprises at least one pair of linking arms pivotally connected together in a scissors arrangement, said linking arms being movable relative to each other to move said pan from the first position to the second position, wherein said position indicator includes an indicator member pivotal to a location in alignment with the surface of said pan, said means for indicating comprises a lever pivotally mounted within said indicator member, and having one end engageable with the component, wherein a relative movement between said indicator member and the component causes said lever to move to a location indicative of a position of the component, and wherein said indicator member includes a slot therein, and a hole positioned at one end of the slot, said lever being positioned within said slot; said means for indicating further comprising a pin located within the hole and being connected with an end of said lever, whereby the relative movement between said indicator member and the component causes the component to contact said pin and move said pin to a position in which an end of said pin is flush with a surface of said indicator member to indicate a desired position of the component.

8. The matrix feeder of claim 7, wherein said pin has a cylindrical shape, and has a groove arranged around a circumference thereof and between opposing ends of said pin, the end of said lever being positioned within the groove to form the connection between said pin and said lever.

9. A method of setting a height of a component, comprising:

locating the component on a pan;

positioning an indicator over the component;

raising the pan until the component contacts and moves the indicator; and determining a height of the component based on an amount of movement of the indicator.

10. A matrix tray feeder, comprising:

a matrix tray platform, including a pan for receiving a component, and an adjustment mechanism connected to said pan and being activatable to move said pan from a first position to a second position while maintaining a surface of said pan in one of an infinite number of substantially parallel planes; and a position indicator including an indicator member pivotal to a location over the surface of said pan, and including means for indicating when the component is in a desired position during the activation of said adjustment mechanism, whereby when the component is in the desired position, said matrix tray platform is in the second position, said means for indicating comprising a lever pivotally mounted within said indicator member, and having one end engageable with the component, wherein when the one end of said lever is in contact with the component, a relative movement between said indicator member and the component causes said lever to move to a location that indicates a position of the component.

11. A method of feeding components to a surface mounted technology machine, which comprises utilizing the matrix tray feeder of claim 10.

12. The matrix tray feeder of claim 10, wherein said adjustment mechanism comprises at least one pair of linking arms pivotally connected together in a scissors arrangement, said linking arms being movable relative to each other to move said pan from the first position to the second position.

13. The matrix tray feeder of claim 12, wherein one end of one of said linking arms is pivotally connected to an underside of said pan, and one end of the other of said linking arms is slidably mounted to the underside of said pan.

14. The matrix feeder of claim 10, further comprising a transport arrangement for moving said matrix tray platform in a linear direction toward and away from a component placement machine, and comprising at least one rail, and a slide guided upon said rail, said matrix tray platform being mounted upon said slide, with said pan being maintained in a selected position over an entire length of said rail.

15. The matrix tray feeder of claim 14, wherein said at least one rail comprises two, essentially parallel, cylindrically shaped rails, and wherein said slide includes a channel having a cross-sectional profile corresponding to a cross-sectional profile of said rails, said rails being accommodated within said channel.

16. The matrix tray feeder of claim 14, wherein said transport arrangement includes a base plate upon which said rail is mounted, said position indicator being fixed to said base plate.

17. A method of feeding a component to a component placement machine, comprising:

locating a matrix tray platform away from the component placement machine in a component load position;

placing a component on the matrix tray platform;

positioning an indicator over the component;

raising the component until the component contacts and moves the indicator;

determining a height of the component based on an amount of movement of the indicator;

repositioning the indicator away from the component; and sliding the matrix tray platform toward the component placement machine to a component pick-up position, while maintaining the height of the component.

18. The method recited in claim 17, wherein said sliding operations include sliding the matrix tray platform along a rail arrangement.

* * * * *